(12) United States Patent
Liu et al.

(10) Patent No.: US 8,120,445 B2
(45) Date of Patent: Feb. 21, 2012

(54) PLANAR EMI FILTER COMPRISING CORELESS SPIRAL PLANAR WINDINGS

(75) Inventors: Xun Liu, Hong Kong (CN); Chi Kwan Lee, Hong Kong (CN); Ron Shu Yuen Hui, Hong Kong (CN)

(73) Assignee: City University of Hong Kong, Kowloon (HK)

(*) Notice: Subject to any disclaimer, the term of this patent is extended or adjusted under 35 U.S.C. 154(b) by 25 days.

(21) Appl. No.: 12/325,390

(22) Filed: Dec. 1, 2008

(65) Prior Publication Data
US 2009/0146755 A1 Jun. 11, 2009

Related U.S. Application Data

(63) Continuation-in-part of application No. 11/763,638, filed on Jun. 15, 2007, now abandoned.

(51) Int. Cl.
*H03H 7/01* (2006.01)
(52) U.S. Cl. ........................ 333/181; 333/185
(58) Field of Classification Search .................. 333/181, 333/185
See application file for complete search history.

(56) References Cited

U.S. PATENT DOCUMENTS

| | | | |
|---|---|---|---|
| 1,647,474 A | 11/1927 | Seymour | |
| 4,591,814 A | 5/1986 | Ito et al. | |
| 5,039,964 A | 8/1991 | Ikeda | |
| 5,529,831 A | 6/1996 | Waga | |
| 5,548,165 A * | 8/1996 | Mohan et al. | 307/36 |
| 5,583,474 A | 12/1996 | Mizoguchi et al. | |
| 7,623,001 B2 * | 11/2009 | Yeh et al. | 333/181 |
| 2002/0109573 A1 | 8/2002 | Iwanami | |
| 2003/0020583 A1 | 1/2003 | Hui et al. | |
| 2003/0184410 A1 * | 10/2003 | Paulwitz et al. | 333/181 |
| 2007/0205856 A1 | 9/2007 | Matsunaga et al. | |

FOREIGN PATENT DOCUMENTS

| | | |
|---|---|---|
| EP | 0 935 263 A2 | 8/1999 |
| WO | 2006057115 A | 6/2006 |

OTHER PUBLICATIONS

EP Search Report, EP Application No. 08252033.9, dated Oct. 23, 2009.
Biela J. et al.: "Passive and Active Hybrid Integrated EMI Filters", Applied Power Electronics Conference and Exposition, 2006. APEC'06 Twenty-first Annual IEEE, Mar. 19, 2006, Piscataway, NJ, pp. 1174-1180, XP010910094.
Poon N. K. et al.: "Techniques for Input Ripple Current Cancellation: Classification and Implementation" Transactions on Power Electronics, Service Center, Piscataway, NJ, vol. 15, No. 6. Nov. 1, 2000, XP011043504. EP Search Report, EP Application No. 08252033.9, dated Oct. 23, 2008.
Jillek et al., "Embedded Components in Printed Circuit Boards: A Processing Technology Review", International Journal of Advanced Manufacturing Technology, vol. 25, Nos. 3-4, pp. 350-360 (Feb. 1, 2005).

* cited by examiner

*Primary Examiner* — Benny Lee
(74) *Attorney, Agent, or Firm* — Kevin P. Radigan, Esq.; Heslin Rothenberg Farley & Mesiti P.C.

(57) ABSTRACT

An EMI filter for use between a power source and an electronic product is formed of at least one planar element including a pair of opposed coreless spiral planar windings, and a planar capacitor. This enables the integration of common mode and differential mode filters into integrated planar structures. Furthermore the planar EMI filter may be combined with an active filter element to provide a hybrid EMI filter comprising both passive and active elements with superior performance.

19 Claims, 14 Drawing Sheets

FIG. 1

PRIOR ART

FIG.14(a) and (b)

PLANAR EMI FILTER COMPRISING CORELESS SPIRAL PLANAR WINDINGS

CROSS-REFERENCE TO RELATED APPLICATION

This application is a Continuation-In-Part (CIP) application of U.S. patent application Ser. No. 11/763,638, filed Jun. 15, 2007, now abandoned, entitled "Planar EMI Filter", which is hereby incorporated herein by reference in its entirety.

FIELD OF THE INVENTION

This invention relates to a planar EMI filter, and in particular to such a filter suitable for use with ultra-high frequency power converters.

BACKGROUND OF THE INVENTION

EMI filters are routinely provided with electrical and electronic devices to ensure that any electromagnetic noise generated by the device is not allowed to pass back into the main power supply. Generally such filters are classified as being either differential mode (DM) filters comprising inductive elements in the live and neutral lines, or common mode (CM) filters comprising capacitive elements between the live and neutral lines and ground.

Traditionally EMI filters are constructed by conventional circuit components including in particular discrete capacitive and inductive components provided on a circuit board. However, with increasing miniaturization of electronic components such EMI filters may become disproportionately large with respect to the associated circuits and components that are being filtered. There is therefore a need for more compact EMI filter designs, and in particular for EMI filters that can be integrated with other electronic components in an electronic device.

Known in the art are coreless planar spiral windings (CPSW) that may be used in coreless transformers. A CPSW may be formed in a number of ways, for example by depositing conductive tracks on a printed circuit board and when used in a coreless transformer for signal and/or power transfer primary and secondary windings may be formed as CPSWs on opposing sides of a suitable dielectric substrate. In addition to their use in coreless transformers for power and signal transfer, such planar spiral windings have also been proposed for use in integrated EMI filters with the help of ferrite materials. Coupled coreless planar spiral windings have also been proposed to cancel the capacitor parasitic inductance in traditional EMI filters. It has also been known to use CPSW as the inductive elements in differential mode EMI filters, but such prior proposals have always continued to use discrete three-dimensional capacitors that prevent complete integration of the EMI filter structure.

SUMMARY OF THE INVENTION

According to the present invention, there is provided an EMI filter for use between a power source and an electronic product, wherein the EMI filter comprises at least one planar element comprising a pair of opposed coreless spiral planar windings, and a planar capacitor.

In one embodiment, the planar windings are formed on opposed sides of a substrate, such as for example a printed circuit board.

The planar capacitor may comprise at least two parallel conductive plates spaced apart by a dielectric material.

The filter is, in one embodiment, a combined conductive mode filter and differential mode filter. In such an embodiment the conductive mode filter may comprise a first planar element, and the differential mode filter may comprises two planar elements symmetrically disposed in the phase and neutral lines between the power source and the product.

There are a number of possible configurations for such a combined common mode and differential mode filter.

For example, in some embodiments the common mode filter is provided adjacent to the power source and the differential mode filter is provided adjacent to the product. In these embodiments, the planar capacitor may be provided between the common mode filter and the differential mode filter, or between the differential mode filter and the product, or between the power source and the common mode filter.

Alternatively, the differential mode filter may be provided adjacent to the power source and the common mode filter may be provided adjacent to the product. In these embodiments, the planar capacitor may be provided between the power source and the differential mode filter, or between the differential mode filter and the common mode filter, or between the common mode filter and the product.

According to one embodiment of the invention, the spiral planar windings are formed such that rings of the spiral planar windings are formed on opposite sides of a substrate and are electrically interconnected by vias whereby each side of the substrate is formed with alternating rings belonging to the respective spiral windings.

Furthermore, preferably the planar EMI filter of embodiments of the invention may be combined with an active filter element that may be provided at the middle-stage, at the end-stage or at both the middle- and end-stage of the filter.

According to another aspect of the present invention therefore there is provided an EMI filter comprising a passive filter and an active filter wherein said passive filter comprises at least one planar element comprising a pair of opposed coreless spiral planar windings, and a planar capacitor.

BRIEF DESCRIPTION OF THE DRAWINGS

Some embodiments of the present invention are described below by way of example and with reference to the accompanying drawings, in which.

DETAILED DESCRIPTION OF PREFERRED EMBODIMENTS

Figure 1:
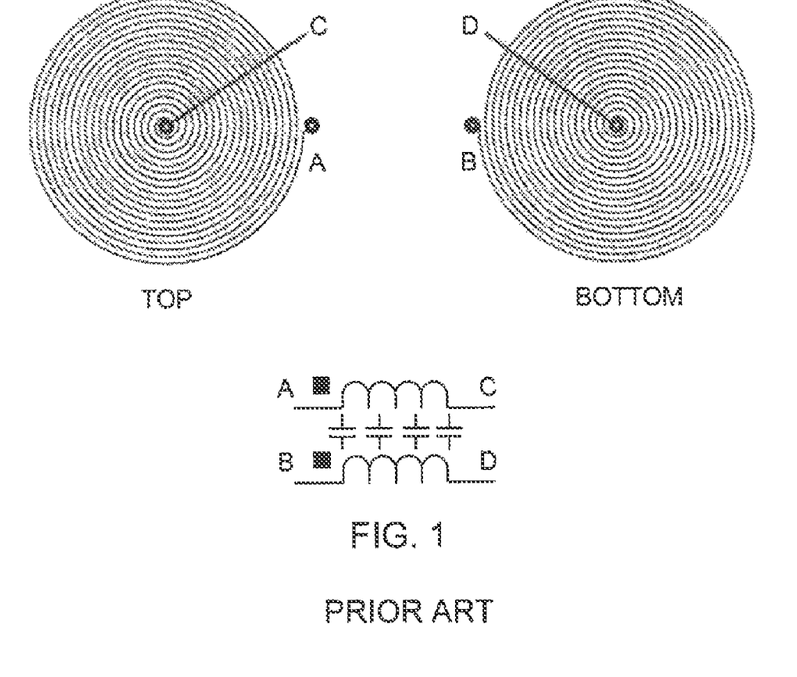
FIG. 1 shows schematically two coreless planar spiral windings and their equivalent circuit.

FIG. 1 shows two conventional spiral windings. The dimensions and number of turns of the windings may vary depending on the intended application. The windings can be constructed with printed circuit board (PCB) or other substrates such as semiconductor materials. For construction in the PCB, the windings may be formed on opposed sides of a PCB substrate, e.g. 0.4 mm thick and may form the primary and secondary coils of a coreless transformer as is known in the art. For convenience of description throughout this specification the ends of the top coil may be labeled A and C, while the corresponding ends of the bottom coil may be labeled B and D. As shown in FIG. 1, when placed on opposite sides of a substrate the two planar spiral windings may be represented electrically as two inductances with a capacitive component between them.

Figure 2:
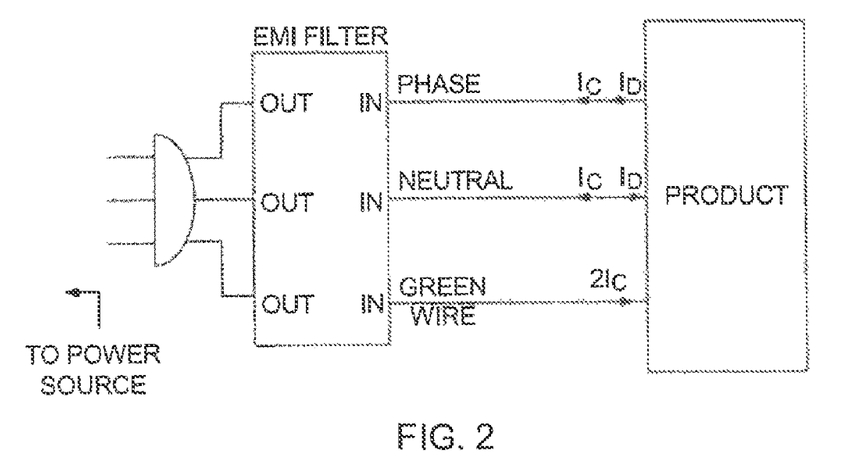
FIG. 2 shows schematically the role of an EMI filter.

FIG. 2 shows a simple block diagram of the function of an EMI filter, wherein "IN" and "OUT" refer to the input and output terminals, respectively, of the EMI filter. The function of the EMI filter is to block and/or divert the conducted emission current in common mode ($I_C$) and differential mode ($I_D$) from the PRODUCT on the phase, neutral, and green wire lines so that they do not enter the power source (identified in FIG. 2 by the TO POWER SOURCE indication) wherein $2I_C$ identifies the common mode current.

Figure 3:
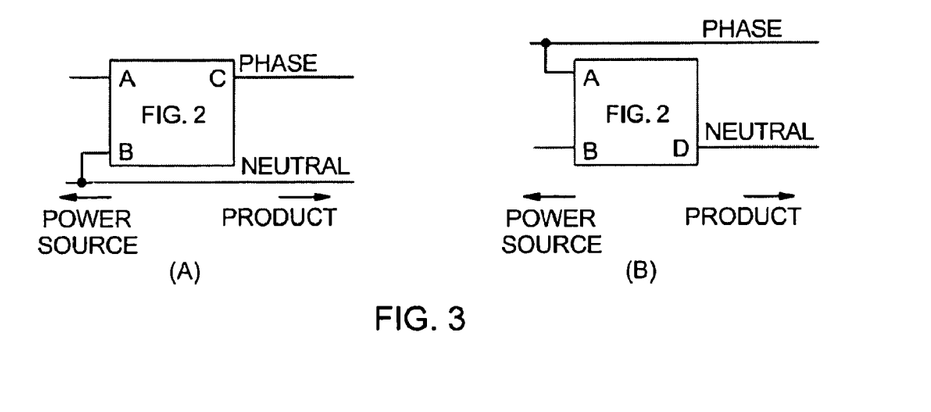
FIGS. 3a and 3b illustrate two examples of the use of a coreless planar spiral winding as a direct mode filter.

FIG. 3a shows how two planar spiral windings formed on opposed sides of a substrate may be employed as a DM filter (FIG. 2) added on the phase line. Using the nomenclature of FIG. 1 the phase line from the power source, which is located upstream from the DM filter (as identified in FIG. 3a by the POWER SOURCE indication) is connected at A and the phase line goes from C at the filter to the device (i.e. PRODUCT, which is located downstream from the DM filter as indicated in FIG. 3a by the PRODUCT indication). Point B is connected to the neutral line which extends between the power source and the device. FIG. 3b shows how the same windings can be employed as a DM filter (FIG. 2) added on the neutral line. In this example, point A is connected alone to the phase line, which extends between the power source and the product (as identified in FIG. 3b by the POWER SOURCE indication and the PRODUCT indication), while the neutral line from the power source is connected at point B and the neutral line goes from point D to the device (i.e. PRODUCT).

Figure 4:
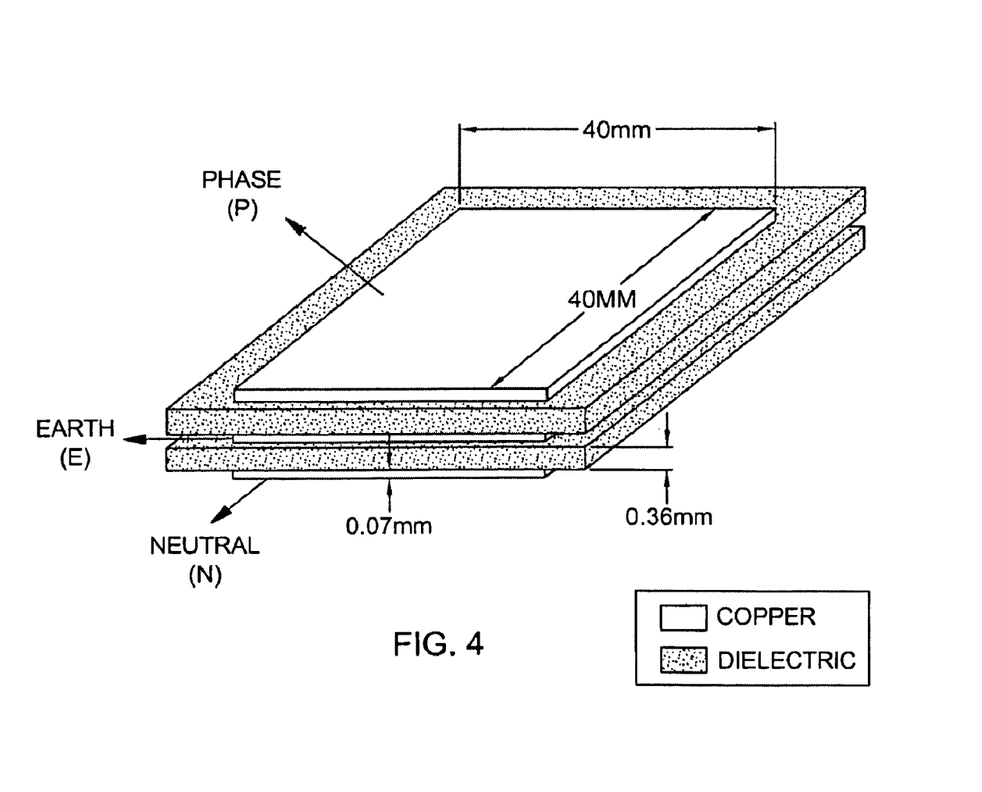
FIG. 4 shows an example of a planar capacitor as may be used in embodiments of the invention.

An aspect of the present invention, at least in various embodiments, is the integration of planar CM and DM filter elements with planar capacitive elements such that the complete filter structure can be more easily integrated in its own design and also with other circuit elements. In this connection embodiments of the invention may employ one or more planar capacitors an example of which is shown in FIG. 4. As shown in FIG. 4, this planar capacitor may comprise three planar copper layers in a sandwich-like structure separated by dielectric layers. The three copper layers may respectively be connected to the phase (P), earth (E) and neutral N) lines as may be required in any particular circuit diagrams. By way of example only, typical dimensions may be 40 mm×40 mm×0.07 mm for the copper layers, and a thickness of 0.36 mm for the interleaving dielectric layers. The dielectric material may be a simple PCB substrate, or may be a material of higher permittivity if a higher capacitance is required.

Figure 5:
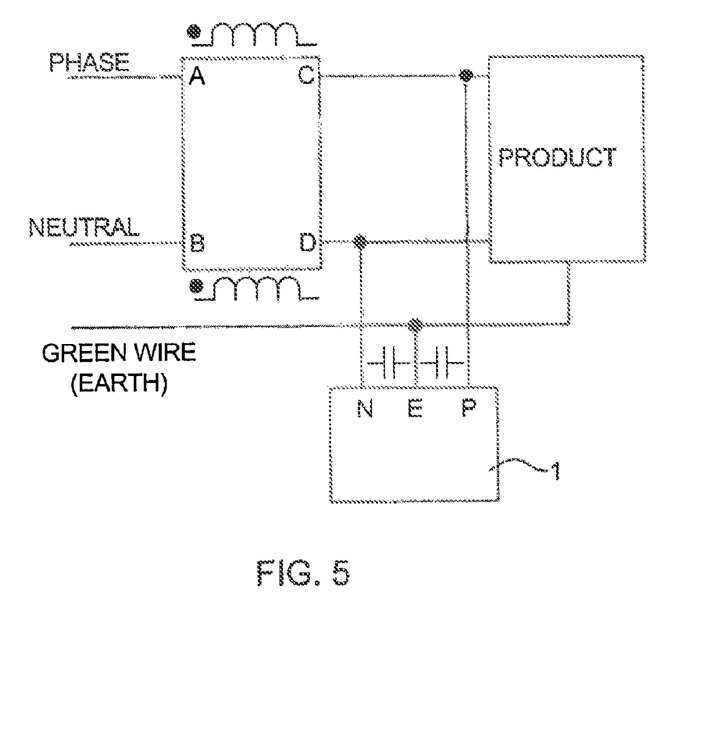
FIG. 5 shows an example of a common mode filter according to an embodiment of the invention.

FIG. 5 shows how a planar capacitor 1 may be used in conjunction with a planar spiral winding structure to form a common mode filter. The planar spiral windings are connected in the phase and neutral lines between the power source and the product with the phase line from the power source being connected at A and the phase line extending to the product from C. Similarly the neutral line from the power source is connected at B and the neutral line continues to the product from D. A planar capacitor 1 constructed as shown in FIG. 4 is connected to the phase and neutral lines between the spiral windings and the product, with the neutral (N), phase (P), and earth (E) layers of the capacitor 1 being connected to the respective neutral line, phase line and green wire (earth) lines.

Figure 6:
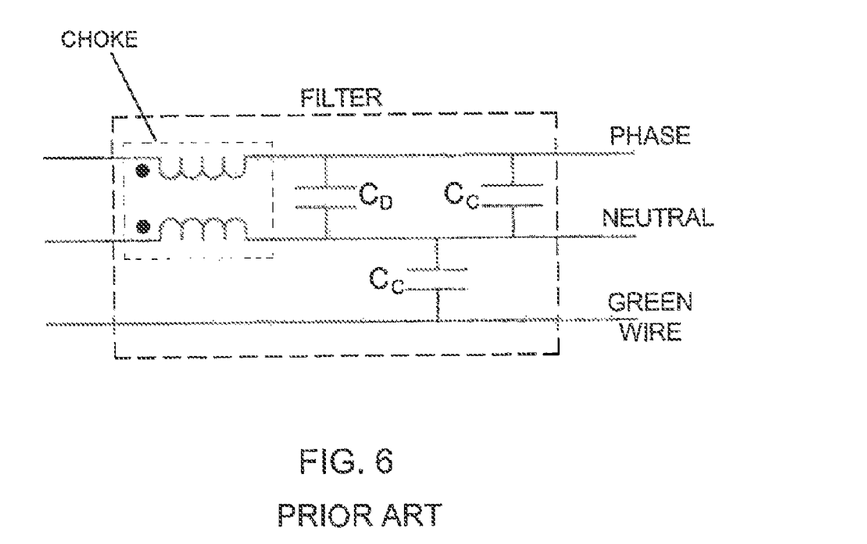
FIG. 6 shows a conventional combined CM and DM EMI filter.

The examples above show DM and CM filters separately, but they may be combined in a single EMI filter coupled between the phase, neutral and green wire lines connecting a POWER SOURCE and PRODUCT. FIG. 6 shows how this is done in a conventional EMI filter. A conventional combined filter normally consists of a CM choke (indicated as CHOKE in FIG. 6) as well as CM capacitors ($C_C$) and a DM capacitor ($C_D$) as shown in FIG. 6. Such a conventional design can be looked at as a CM filter with a DM capacitor added, but when a CM choke is used in a DM filter only a very small leakage inductance remains effective for filtering because of flux cancellation and so a large DM capacitor $C_D$ is needed to achieve the required filtering effect. Providing such a large capacitance in a planar capacitor structure as shown in FIG. 4 requires either an undesirably large area, or a dielectric material of high permittivity.

Figure 7:
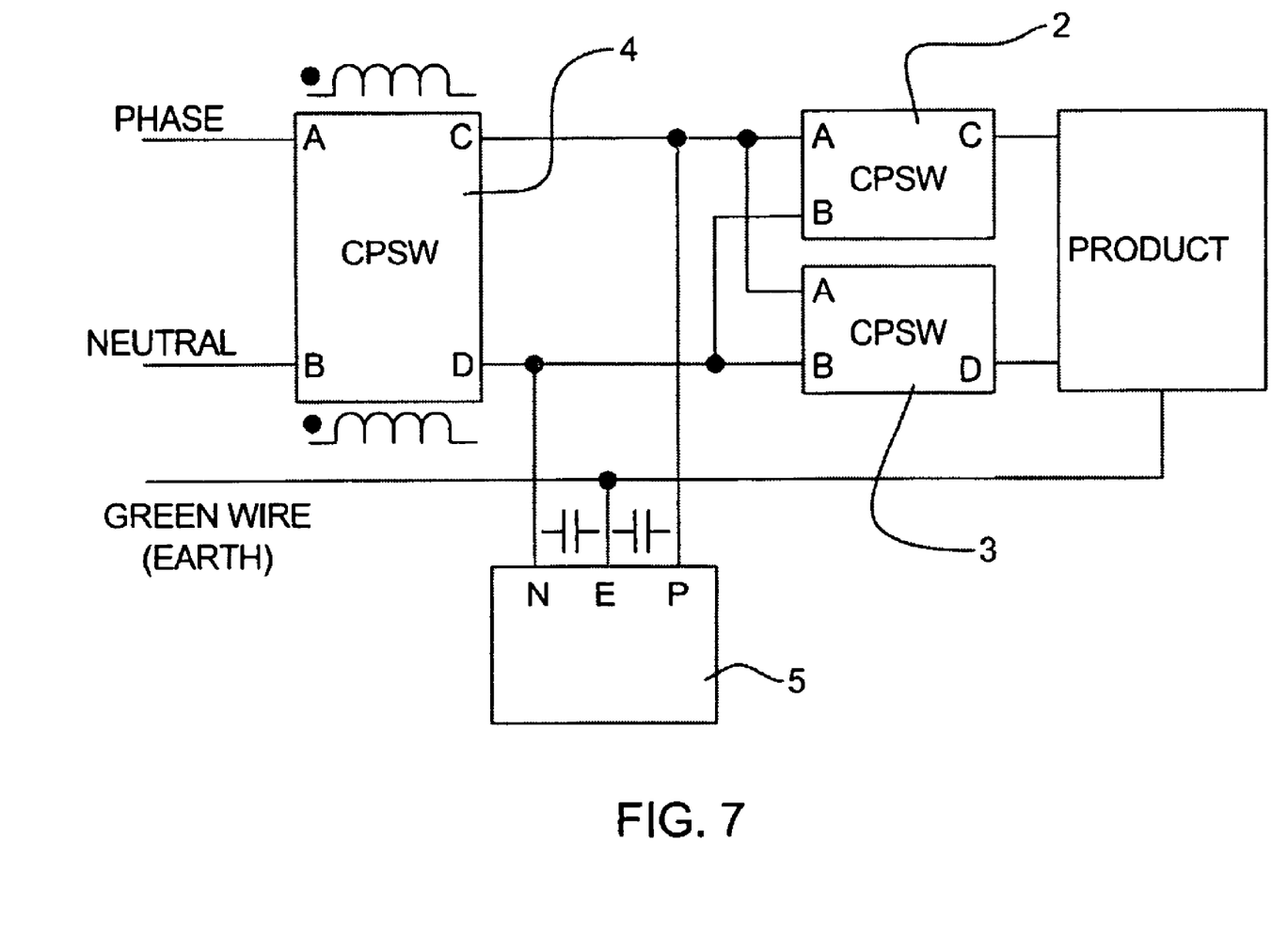
FIG. 7 shows a combined CM and DM EMI filter according to an embodiment of the invention.

FIG. 7 shows a combined CM and DM filter using coreless planar spiral windings (CPSW) and planar capacitors that mitigate this problem. In this embodiment, two DM filters 2, 3 respectively are employed of the forms shown in FIG. 3a and FIG. 3b and with filter 2 added to the phase line (PHASE) and filter 3 added to the neutral line (NEUTRAL), both of which lines extend between a device (PRODUCT) and a power supply (not pictured). These two DM filters provide the DM EMI filtering while retaining filter circuit symmetry. CM filtering is provided by CM filter 4 which is of the form shown in FIG. 5 including the planar capacitor 5 which has its neutral layer (N), earth layer (E), and phase layer (P) connected to the neutral, green wire (earth), and phase lines, respectively. It will be noted that terminal C in the CM filter 4—which is in the phase line—connects to terminals A in both the DM filters 2 and 3, while terminal D in the CM filter 4—which is in the neutral line—connects to terminals B in the DM filters 2 and 3. One advantage of this circuit design is that the capacitive elements in the CM filter 4—both the planar capacitor and the distributed capacitance in the spiral windings—contribute to the overall DM filtering.

Figure 8:
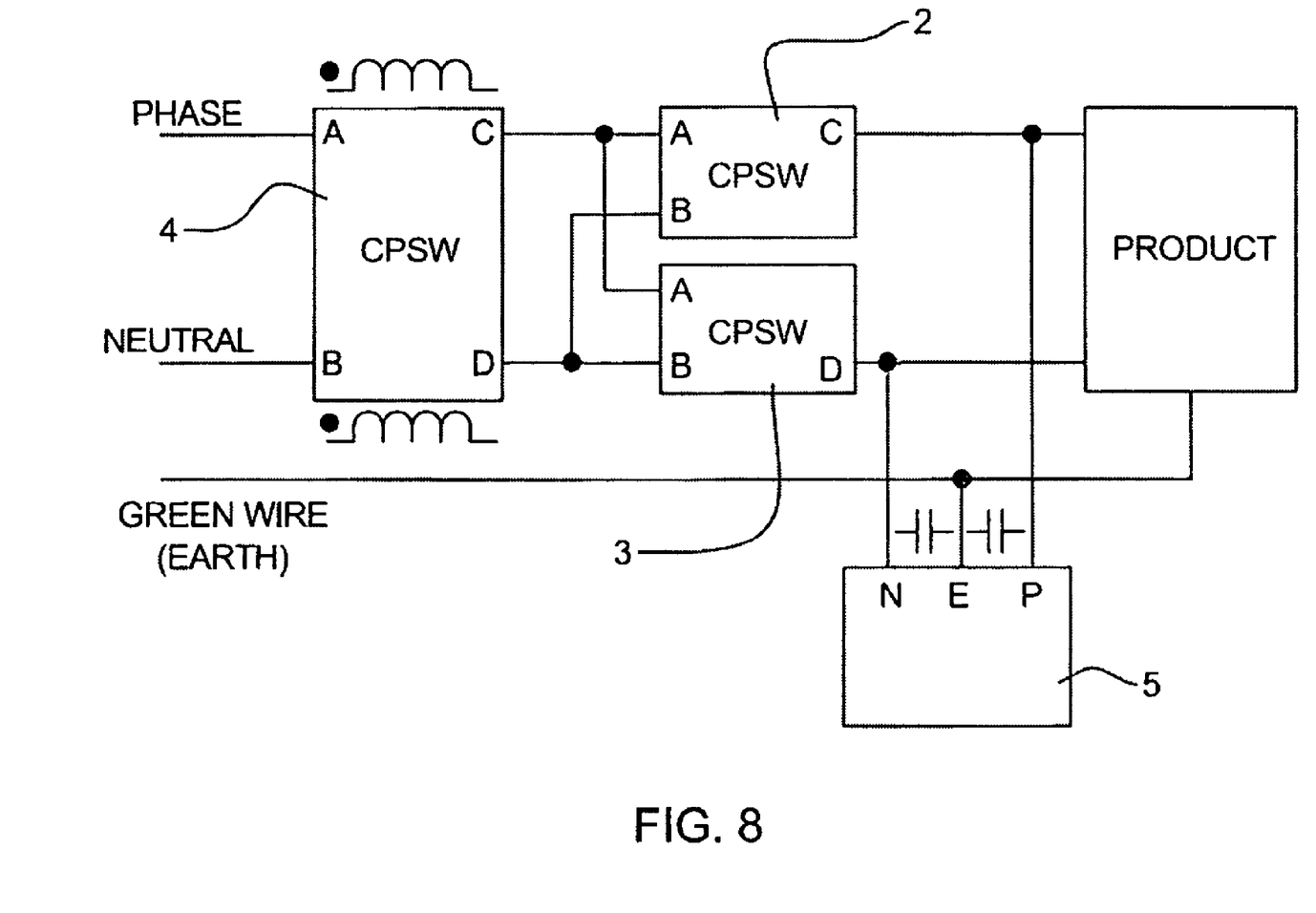
FIG. 8 shows a combined CM and DM EMI filter according to another embodiment of the invention.
Figure 9:
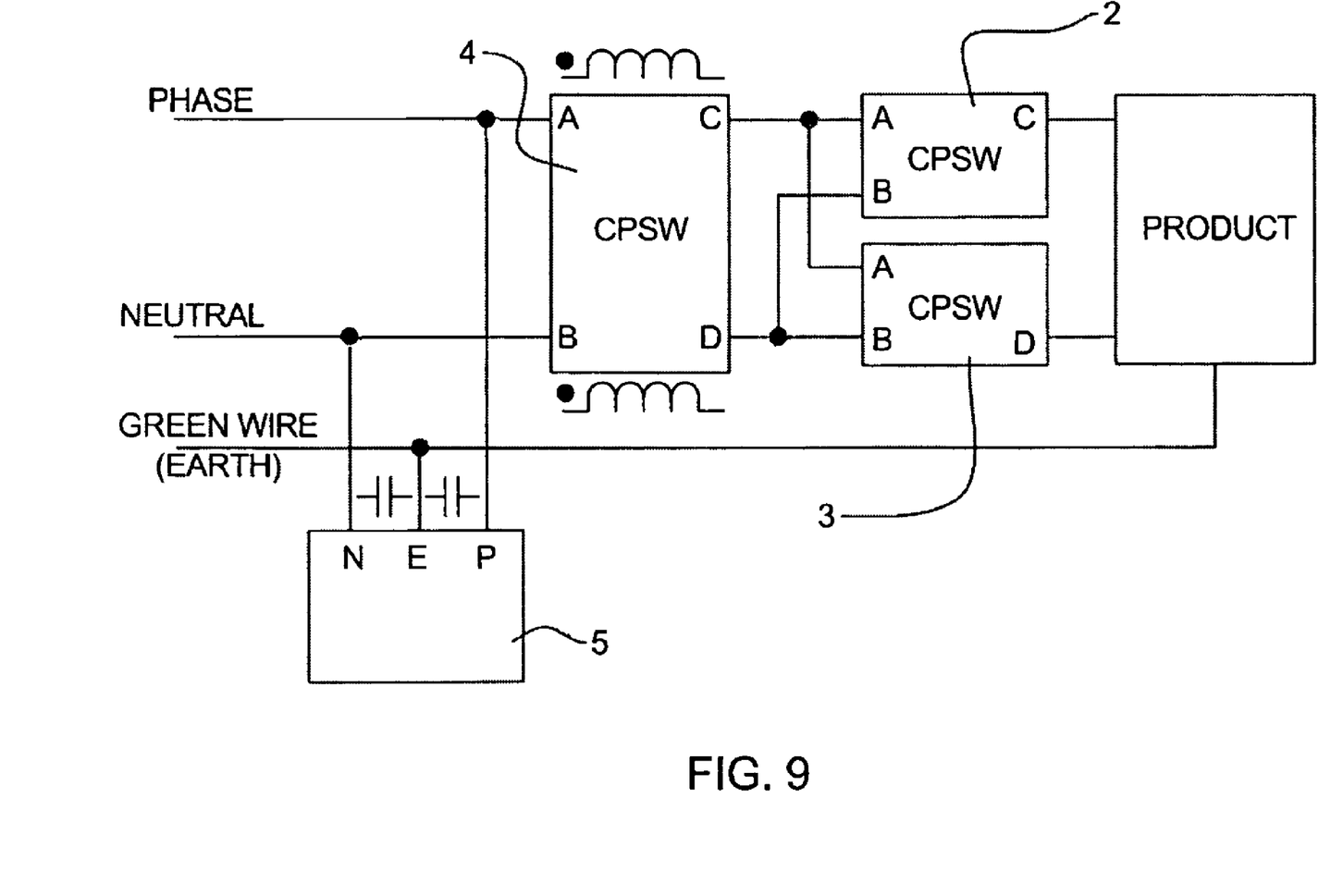
FIG. 9 shows a combined CM and DM EMI filter according to another embodiment of the invention.

Viewed in the direction of from the power source to the product, the combined filter of FIG. 7 may be considered to have the structure CM choke+planar capacitor+DM filter. FIGS. 8-12 show modifications of the embodiment of FIG. 7 using the same reference labels as those of FIG. 7 described above to denote similar components. In FIG. 8 instead of being provided between the CM and DM spiral windings, the planar capacitor 5 is provided between the DM filters and the electrical product. This structure is therefore CM choke+DM filter+planar capacitor. A further possibility is the sequence planar capacitor+CM choke+DM filter as shown in FIG. 9 where the planar capacitor is located before the CM choke and the DM filters, from the power source (not pictured).

Figure 10:
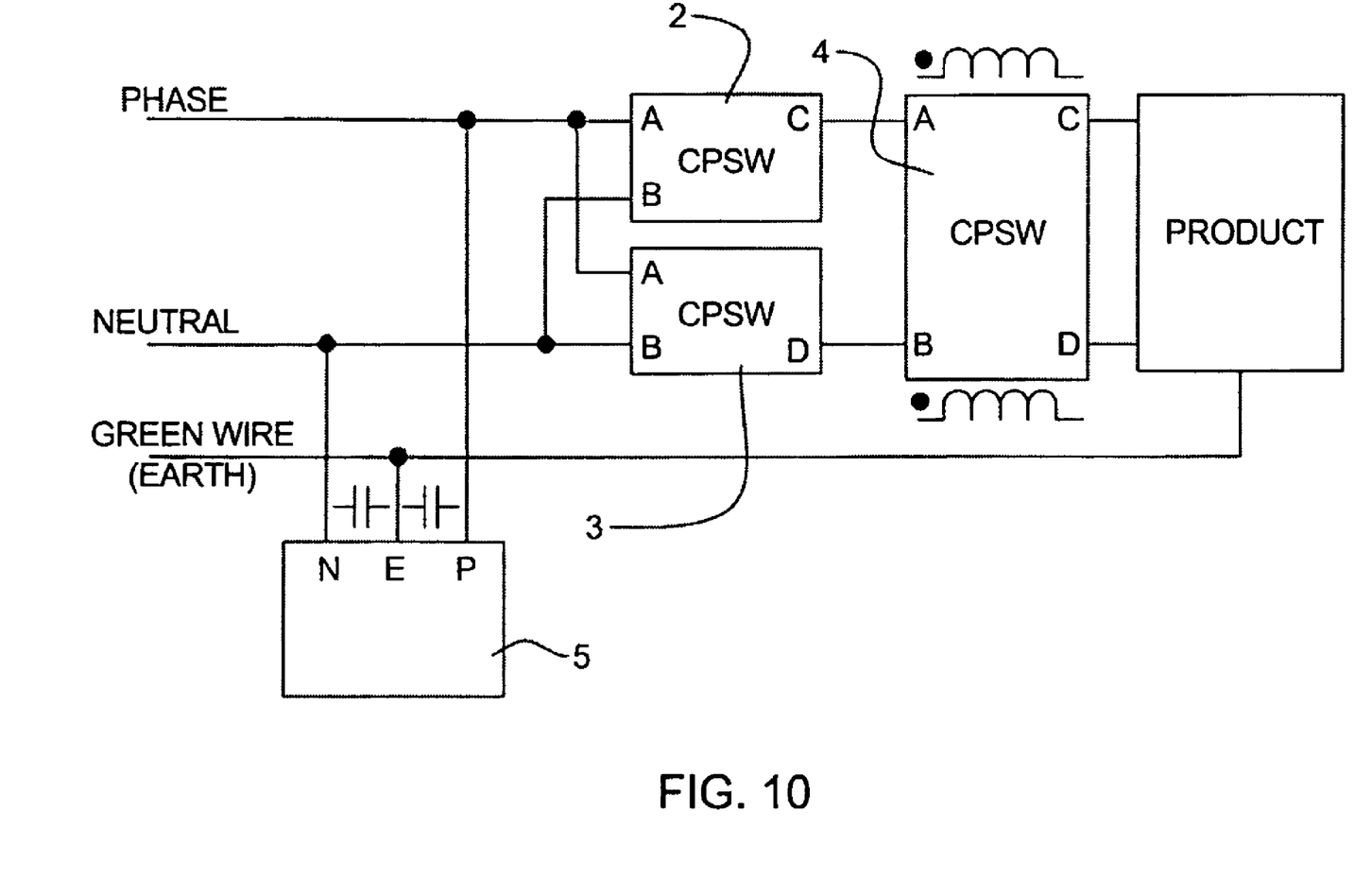
FIG. 10 shows a combined CM and DM EMI filter according to another embodiment of the invention.
Figure 11:
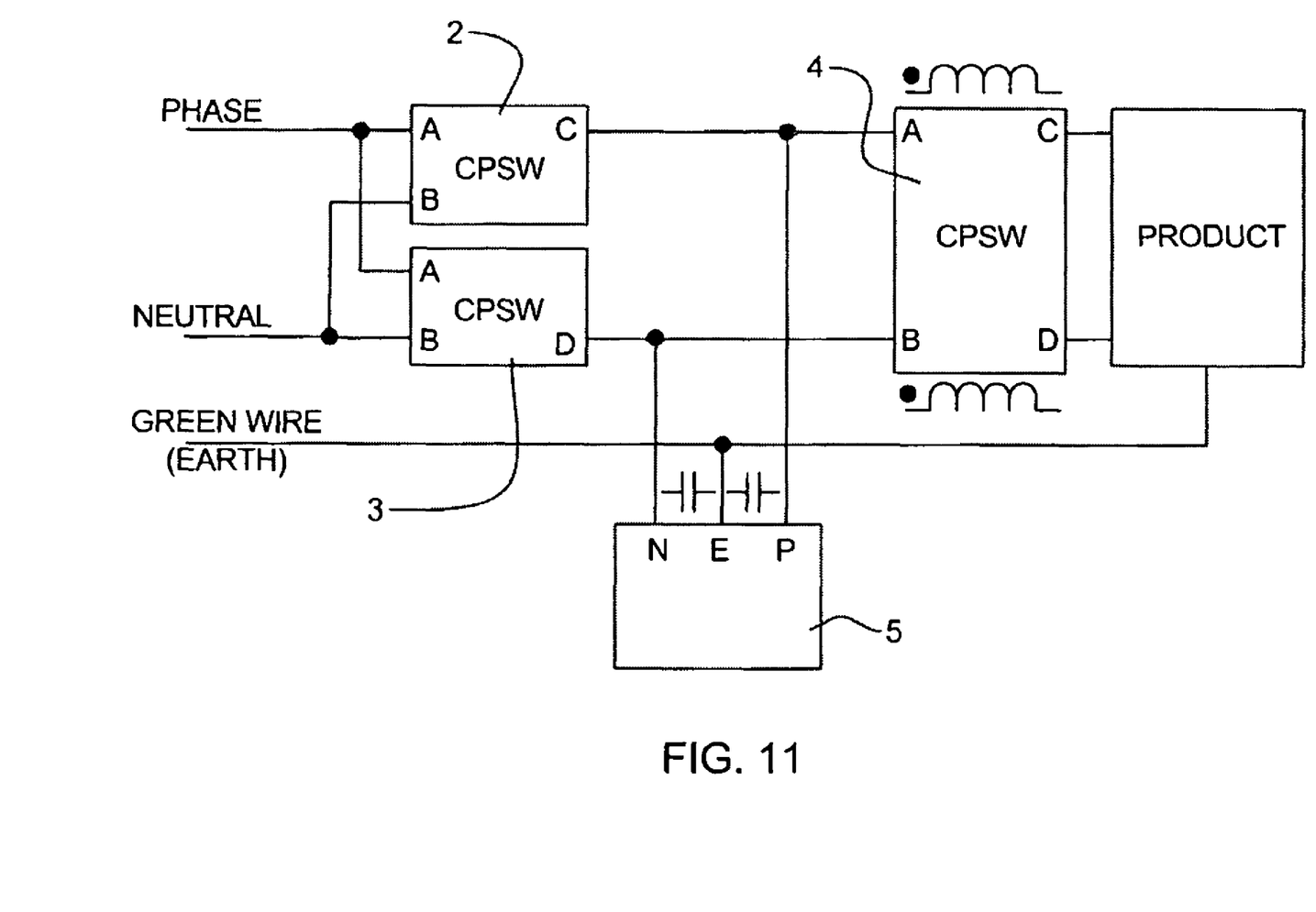
FIG. 11 shows a combined CM and DM EMI filter according to another embodiment of the invention.
Figure 12:
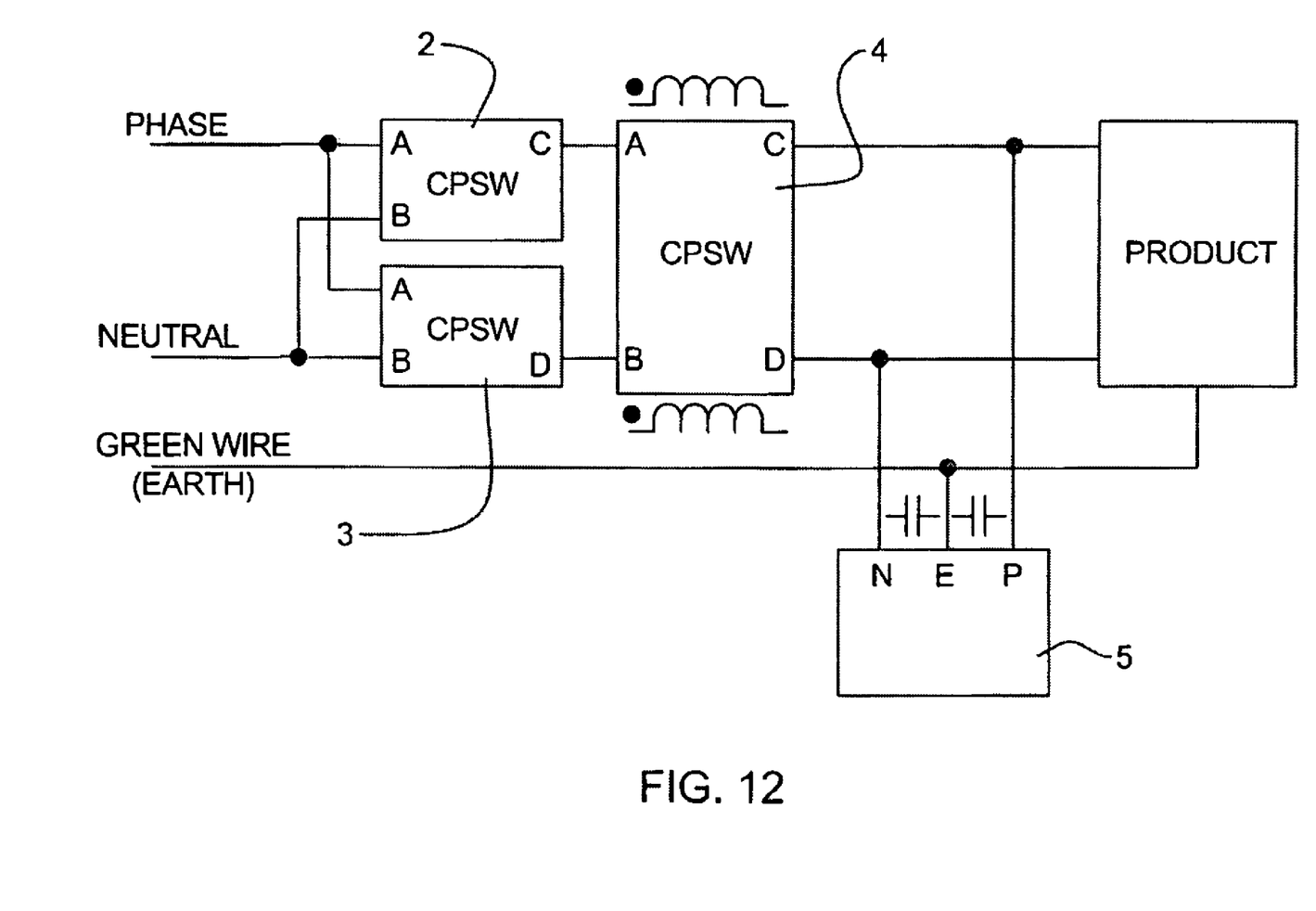
FIG. 12 shows a combined CM and DM EMI filter according to another embodiment of the invention.

It is also possible for the DM filters to be located on the source side and the CM choke to be located on the product side. This possibility is shown in the embodiments of FIGS. 10 to 12, which differ in terms of location of the planar capacitor. FIG. 10 has the structure planar capacitor+DM filter+CM choke with the planar capacitor being located before the DM filters and choke, from the power source (not pictured). In FIG. 11, the planar capacitor is located between the DM filter and the CM choke, i.e., DM filter+planar capacitor+CM choke, while in FIG. 12 the planar capacitor is located between the CM choke and the product, that is, the structure is DM filter+CM choke+planar capacitor.

Figure 13:
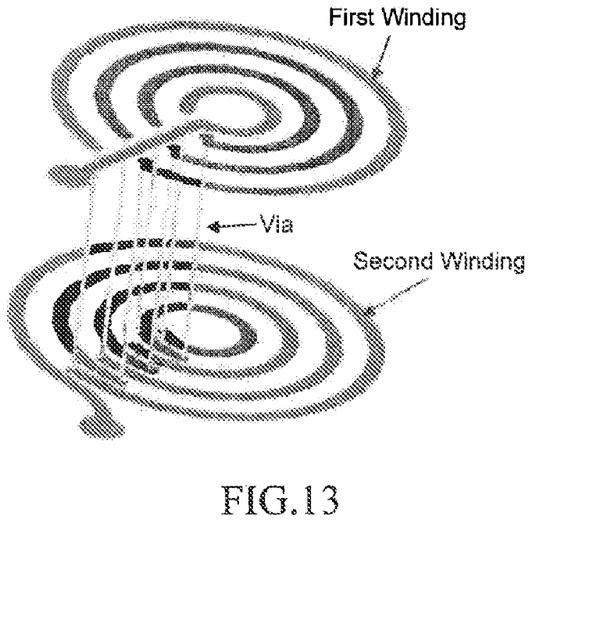
FIG. 13 illustrates an alternating stacked winding structure for use in embodiments of the invention, FIGS. 14(a) and (b) illustrate one example of an active filter that may be combined with a planar EMI filter in accordance with further embodiments of the invention.

It should be noted that a stacked spiral winding structure can be used for the planar windings in which the winding structure comprises turns alternately on both sides of the substrate, as shown in FIG. 13. In such a structure, a first winding starts from the center of the spiral on the first side of the substrate, and after the first loop (ring), the winding passes through the substrate by means of a via such that the second loop is on the opposite side of the substrate from the first loop. After the second loop, the winding returns by means of another via to the first side of the substrate and the winding repeats, thus alternating between the two sides of the substrate. The second winding starts on the opposite side of the substrate from the first winding, and like the first winding, alternates from side of the substrate to the other. The advantage of this structure is that it greatly reduces the stray capacitance of the inductor which can consequently significantly increase the bandwidth. Such a structure may be particularly useful in power converters operating in the mega Hertz switching frequency range.

Figure 14A:
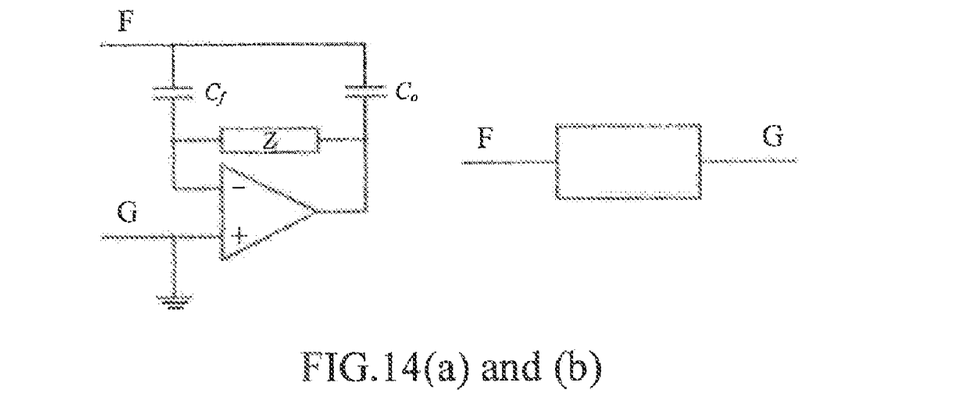

The planar EMI filter of embodiments of the present invention may also advantageously be used in combination with an active filter to provide effective noise suppression over a very wide bandwidth. Four basic types of active EMI filters have been proposed (Thomas Farkas and Martin F. Sehlecht, "Viability of Active EMI Filters for Utility Applications", *IEEE Transactions on Power Electronics*, Vol. 9, No. 3, May 1994, pp. 328-336; David C. Hamili, "An Efficient Active Ripple Filter for Use in DC-DC Conversion", *IEEE Transactions on Aerospace and Electronic Systems*, Vol. 32, No. 3, July 1996, pp. 1077-1084; N. K. Poon, J. C. P. Liu, C. K. Tse, and M. H. Pong, "Techniques for Input Ripple Current Cancellation Classification and Implementation", *IEEE Transactions on Power Electronics*, Vol. 15, No. 6, November 2000, pp. 1144-1152) and in the following embodiment an active filter in the form of a voltage feed-forward sensing and active coupling active filter will be used. In this embodiment, the active filter includes an operational amplifier and two shunt capacitors $C_f$ and $C_o$ connected at both the input and output of the operational amplifier, and having an impedance $Z_f$ coupled between $C_f$ and $C_o$ as shown in FIG. 14(*a*). For the sake of simplicity in the following discussion, the active filter of FIG. 14(*a*) is treated as a building block with terminals F and G as shown in FIG. 14(*b*) where port G is always connected to ground.

Figure 15:
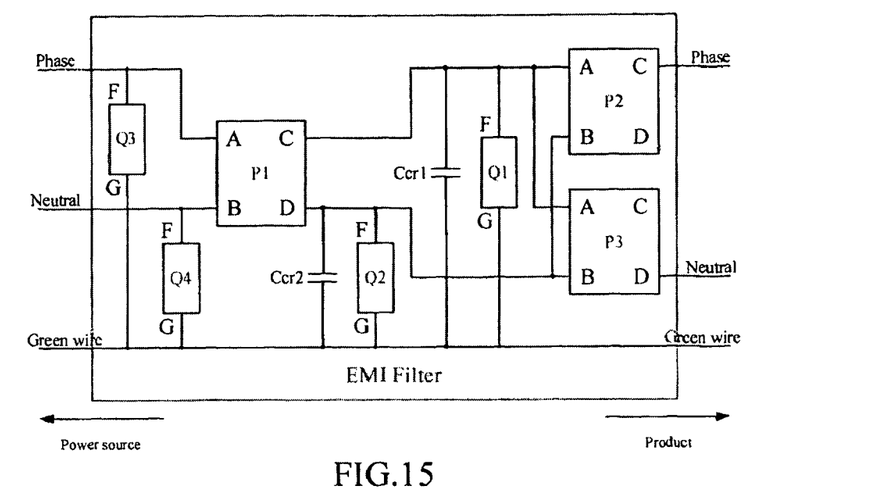
FIG. 15 illustrates schematically a hybrid EMI filter comprising passive and active components according to an embodiment of the invention.

FIG. 15 is a schematic view illustrating how a hybrid passive and active integrated EMI filter may be constructed in line with phase, neutral, and earth (green wire) lines between a power source and device (identified in FIG. 15 by the Power source indication, and the Product indication, respectively). In FIG. 15, the blocks labeled "P" (i.e. P1, P2, P3) comprise planar EMI filters in accordance with embodiments of the invention, while blocks labeled "Q" (i.e. Q1, Q2, Q3, Q4) comprise active filter blocks as shown in FIG. 14(*b*). Points A, B, C & D are the same points on the EMI filter as described above, while points F&G identify the terminals of the active filer blocks (Q1, Q2, Q3 & Q4). FIG. 15 shows several possible locations for the active components which may be located at the middle-stage, the end-stage or both the middle- and end-stages of the planar EMI filter. Different locations of the active filter(s), and inclusion of capacitor(s) Cer1 and Cer2 as necessary (as would be recognized by one having ordinary skill in the art), will create different configurations for the EMI filter as shown in the following table:

| FILTER | DESCRIPTION | BUILDING BLOCKS |
| --- | --- | --- |
| EMI FILTER I (PASSIVE FILTER) | CORELESS PLANAR SPIRAL WINDING (CPSW) BASED EMI FILTER | P1 + P2 + P3 |
| EMI FILTER II (ACTIVE FILTER) | SINGLE-STAGE ACTIVE FILTER | Q3 + Q4 |
| EMI FILTER III (HYBRID FILTER-1) | CPSW BASED + MIDDLE-STAGE ACTIVE FILTER | P1 + P2 + P3 + Q1 + Q2 |
| EMI FILTER IV (HYBRID FILTER-2) | CPSW BASED + END-STAGE ACTIVE FILTER | P1 + P2 + P3 + Q3 + Q4 |
| EMI FILTER V (HYBRID FILTER-3) | CPSW BASED + TWO-STAGE ACTIVE FILTER | P1 + P2 + P3 + Q1 + Q2 + Q3 + Q4 |

Figure 16:
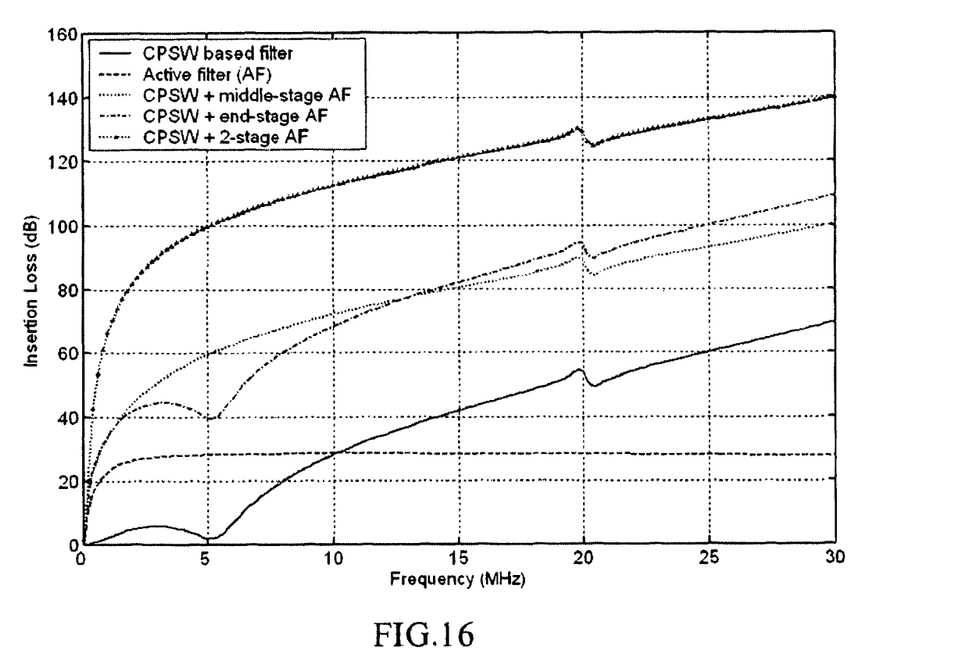
FIG. 16 shows simulated common mode insertion losses for different hybrid filter configurations.

The performance of such a hybrid EMI filter may be considered by looking at performance characteristics such as the insertion loss and measured transfer gain. FIG. 16 shows the simulated results of common-mode insertion-loss performances of the EMI filter I to EMI filter V (as defined in the table above). These results indicate that a simple passive CPSW based filter (Filter I from the Table above—corresponding to the plot labeled "CPSW based filter" and having Insertion Loss of approximately 70 dB at 30 MHz in the graph of FIG. 16) can have high insertion loss ability beyond 10 MHz. The 1-stage active filter (Filter II from the Table above—corresponding to the plot labeled "Active filter (An" and having Insertion Loss of approximately 28 dB at 30 MHz in the graph of FIG. 16) has a high insertion loss at the relatively low frequency range (from kHz to 10 MHz) but lower insertion loss than Filter I beyond 10 MHz. For the three hybrid integrated filters (Filters III, IV, and V from the Table above-corresponding to the plots labeled "CPSW+ middle-stage AF". "CPSW+end-stage AP", and "CPSW+2-stage AF" and having Insertion Loss of approximately 100 dB, 110 dB, and 140 dB at 30 MHz, respectively), the presence of active blocks can boost up insertion loss of the CPSW based filter at low end frequency region (below MHz) significantly so that Filters III to V can achieve good insertion losses over a wide bandwidth for EMI reduction.

Figure 17:
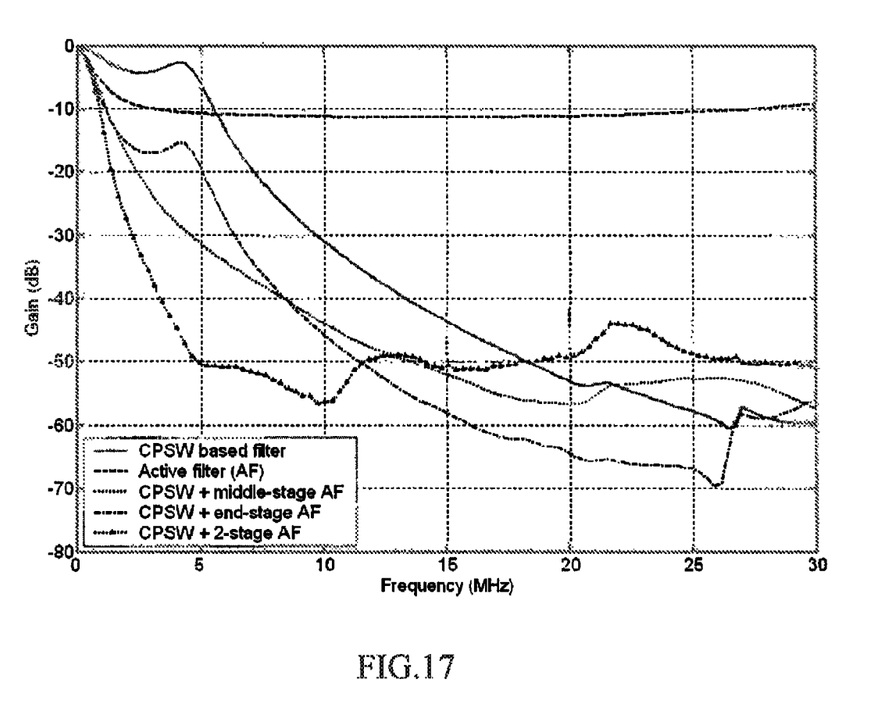
FIG. 17 shows measured common mode transfer gains for different hybrid filter configurations.

Measurements of the common-mode transfer gains for different filter configurations have been obtained and plotted in FIG. 17. The results are obtained with the use of impedance/Gain-Phase analyzer, HP 4194A. The common-mode plot in FIG. 17 shows that the CPSW based filter (corresponding to the plot labeled "CPSW based filter" and having Gain of approximately −59 dB at 30 MHz) can attenuate noise at high frequency range beyond 10 MHz region. The active filter (corresponding to the plot labeled "Active filter (AF)" and having Gain of approximately −9 dB at 30 MHz) offers good noise suppression below 5 MHz, but it does not improve at the high frequency range. However, with the combined use of active filter and the CPSW based filter, the three hybrid filters (corresponding to the plots labeled "CPSW+middle-stage AF". "CPSW+end-stage AF". and "CPSW+2-stage AF" and having Gain of approximately −56 dB, −55 dB, and −51 dB at 30 MHz, respectively) enjoy the advantages of the active and passive filters. They offer good noise attenuation at low and high frequency range up to 30 MHz.

Figure 18:
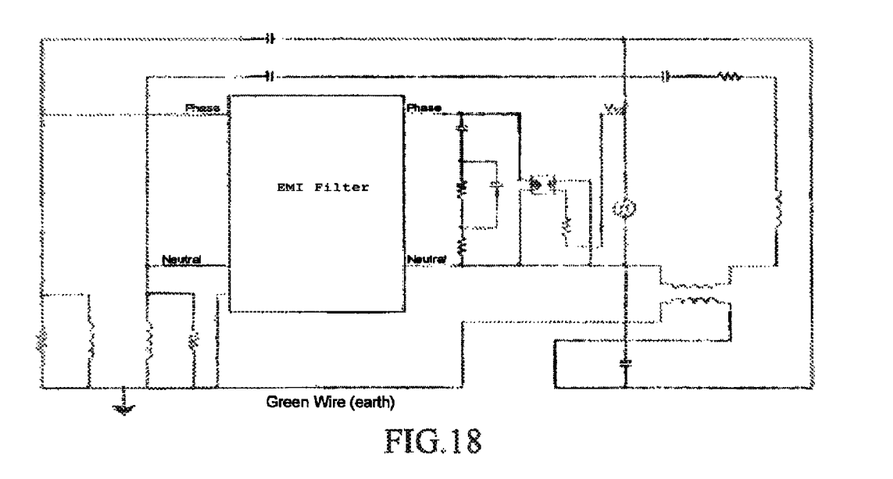
FIG. 18 shows a circuit schematic for use in complete EMI noise simulations.
Figure 19A:
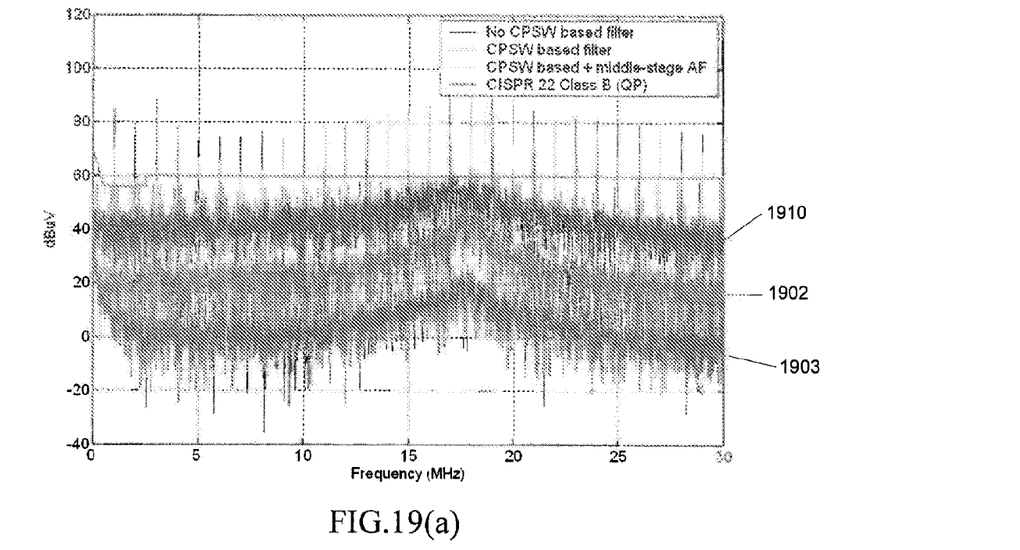
FIGS. 19(a), 19(b), and 19(c) show simulated EMI noise for different filter configurations.
Figure 19B:
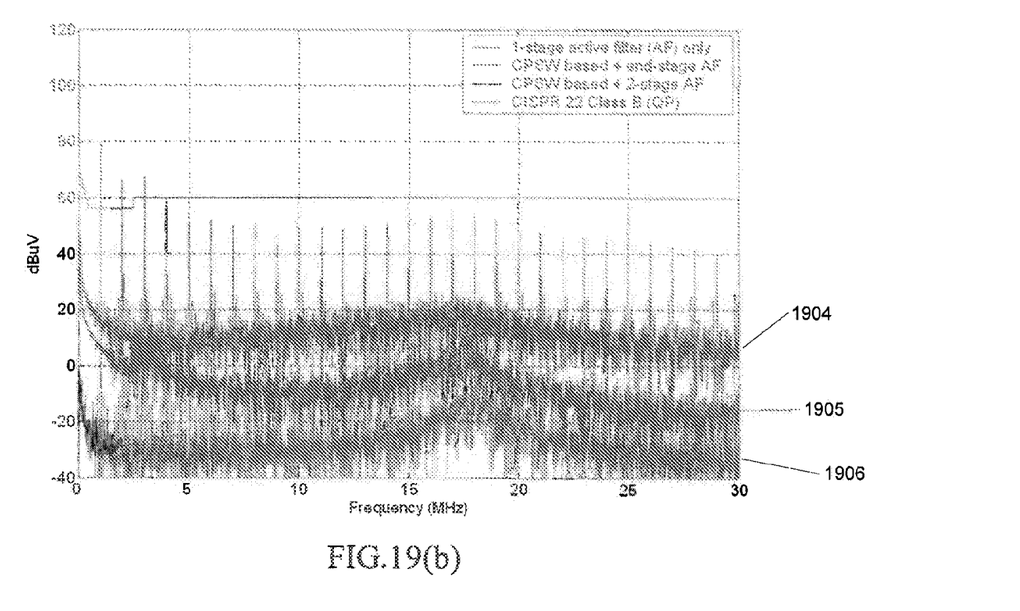
Figure 19C:
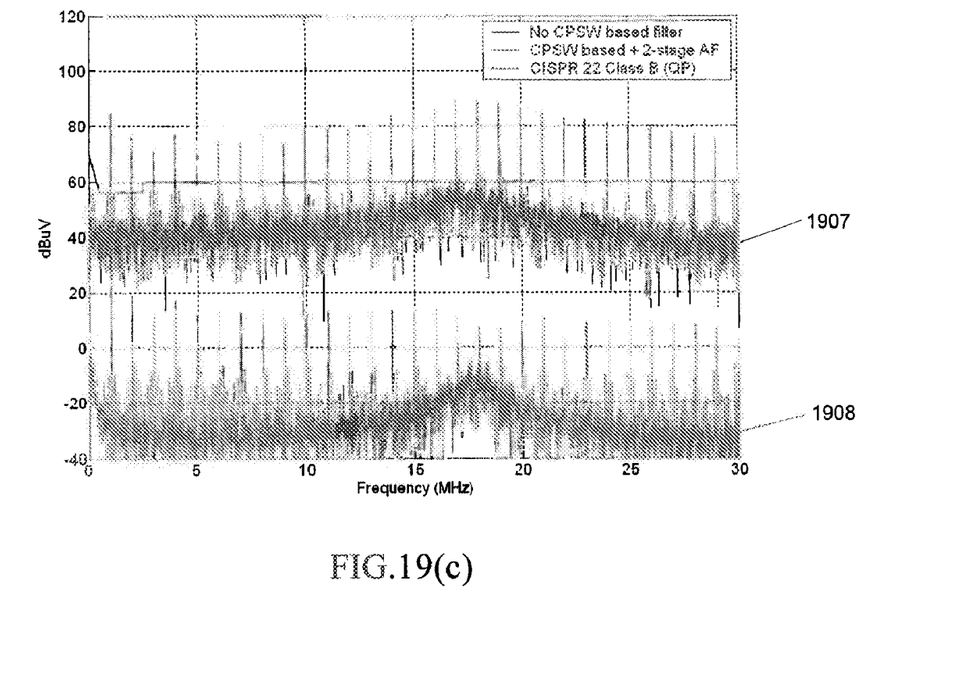

The different filter configurations considered in the above Table can also be put into an EMI simulation model emulating a 20 W converter running at 1 MHz with differential-mode noise generated by an input current source flowing through the input bulk capacitor's equivalent series resistance (ESR). The common-mode noise generation is more complicated and is based on the concept of non-contact coupling paths due to capacitive and inductance coupling. The use of non-contact coupling for common-mode noise would make the model be more realistic. FIG. 18 shows the complete simulation schematic with different filter types (Filter I to Filter V) having been simulated one by one as the EMI Filter connected to Phase, Neutral, and Green wire (earth) lines in FIG. 18. FIGS. 19(a), 19(b) and 19(c) show the simulated results as compared to a CISPR 22 Class B limit line (the plot labeled "CISPR 22 Class B (QP)" and following the 60 dBuV for almost the entire Frequency range in FIGS. 12(a)-19(c)) in which FIG. 19(a) shows simulated noise for "no filter" (plot labeled "No CPSW based filter" and indicated by reference 1910), "Filter I" (plot labeled "CPSW based filter" and indicated by reference 1902) and "Filter III" (plot labeled "CPSW based+middle-stage AF" and indicated by reference 1903) (150 kHz-30 MHz), FIG. 19(b) shows simulated EMI noise for "Filter H" (plot labeled "1-stage active filter (AF) only" and indicated by reference 1904), "Filter IV" (plot labeled "CPSW based+end-stage AF" and indicated by reference 1905) and "Filter V" (plot labeled "CPSW based+2-stage AF" and indicated by reference 1906) (150 kHz-30 MHz), and FIG. 19(c) shows simulated EMI noise for "no filter" (plot labeled "No CPSW based filter" and indicated by reference 1907) and "Filter V" (plot labeled "CPSW based+2-stage AF" and indicated by reference 1908) (150 kHz-30 MHz).

For Filter I (CPSW based filter), the noise level has exceeded the CISPR Class B Limit at the low end of the spectrum. However, with a filter inductance of only a few micro-Henrys, it has attained good filtering capability at the high end of the spectrum. Filter III (CPSW passive+middle-stage active) and Filter IV (CPSW passive+end-stage active) show comparable results which further reduce the noise level of Filter I by 20 to 40 dBµV. These two types of filter configurations still cannot pass the CISPR Class B limit. This can be explained by the fact that some non-contact coupling paths have bypassed the input EMI filter. Even though the filters are of hybrid configurations, the common-mode noise is dominant and cannot be eliminated. Filter V (CPSW passive+2-stage active) has the best filtering performance, reducing the noise level by 20 to 60 dBµV and passing the CISPR Class B limit line in the entire frequency range. It should be noted that the addition of one more stage of active filter at the input can effectively suppress the common-mode noise coming out from the converter due to both contact or non-contact coupling paths.

It will be seen from the above examples that even though the inductance of CPSW is of a few micro-henries only, it is large enough to perform the passive filtering function at the medium and high frequency range. It can also be seen that the addition of an active filter offers good noise attenuation at the relatively low frequency range, whilst the passive CPSW based filter can block high frequency noise. The hybrid EMI filter concept combines the advantages of the active and passive filters and consequently provides good filtering effect over a wide frequency range. The CPSW based passive filter alone may not pass the CISPR 22 Class B limit line in a 20 W converter simulation, but with the addition of 1-stage active filter (end-stage or middle-stage), the filtering performance can reduce noise level by several tens of dBµV while adding 2-stage active filtering onto the CPSW based filter can achieve the best performance and the overall system can pass the EMC limit line. In conclusion, the proposed hybrid EMI filter offers an effective filtering function over a very wide (30 MHz) bandwidth. Such hybrid filter will provide an effective EMI filtering solution to future power converters switching above Mega-Hertz level.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. An EMI filter for use between a power source and an electronic product, said EMI filter comprising at least one planar element comprising a pair of opposed coreless spiral planar windings having a capacitive component, and a planar capacitor distinct from said capacitive component of the pair of opposed coreless spiral planar windings, wherein one spiral planar winding of said pair of opposed coreless spiral planar windings is connected to a phase line, and wherein another spiral planar winding of said pair of opposed coreless spiral planar windings is connected to a neutral line, said phase line and said neutral line electrically coupling said power source and said electronic product.

2. The EMI filter of claim 1, wherein said pair of opposed coreless spiral planar windings are disposed on opposed sides of a substrate.

3. The EMI filter of claim 2, wherein said substrate is a printed circuit board.

4. The EMI filter of claim 1, wherein said planar capacitor comprises at least two parallel conductive plates spaced apart by a dielectric material.

5. The EMI filter of claim 1, wherein said EMI filter comprises a combined common mode filter and differential mode filter.

6. The EMI filter of claim 5, wherein said EMI filter comprises at least three of said planar elements, wherein said common mode filter comprises a first planar element of said at least three planar elements, and wherein said differential mode filter comprises two planar elements of said at least three planar elements symmetrically connected to the phase line and the neutral line between the power source and the electronic product.

7. The EMI filter of claim 6, wherein said common mode filter is disposed adjacent to the power source and wherein the differential mode filter is disposed adjacent to the electronic product.

8. The EMI filter of claim 7, wherein the planar capacitor is disposed between the common mode filter and the differential mode filter.

9. The EMI filter of claim 7, wherein the planar capacitor is disposed between the differential mode filter and the electronic product.

10. The EMI filter of claim 7, wherein the planar capacitor is disposed between the power source and the common mode filter.

11. The EMI filter of claim 6, wherein the differential mode filter is disposed adjacent to the power source and wherein the common mode filter is disposed adjacent to the electronic product.

12. The EMI filter of claim 11, wherein the planar capacitor is disposed between the power source and the differential mode filter.

13. The EMI filter of claim 11, wherein the planar capacitor is disposed between the differential mode filter and the common mode filter.

14. The EMI filter of claim 11, wherein the planar capacitor is disposed between the common mode filter and the electronic product.

15. The EMI filter of claim 1, wherein said pair of opposed coreless spiral planar windings are arranged such that rings of each said spiral planar winding are arranged alternating between opposite sides of a substrate and are electrically interconnected by vias, whereby each said side of the substrate is arranged with alternating rings belong to said respective spiral planar windings.

16. The EMI filter of claim 1, further comprising an active filter element connected to a ground line and at least one of said phase line or said neutral line.

17. The EMI filter of claim 16, wherein the active filter element is disposed at a middle-stage of said EMI filter, at an end-stage of said EMI filter, or at both the middle-stage and the end-stage of said EMI filter.

18. An EMI filter comprising a passive filter and an active filter wherein said passive filter comprises at least one planar element comprising a pair of opposed coreless spiral planar windings having a capacitive component, and a planar capacitor distinct from said capacitive component of the pair of opposed coreless spiral planar windings, wherein one said spiral planar winding of said pair of opposed coreless spiral planar windings is connected to a phase line, and wherein another spiral planar winding of said pair of opposed coreless spiral planar windings is connected to a neutral line, said phase line and said neutral line electrically coupling said power source and said electronic product.

19. The EMI filter of claim 18, wherein the active filter is disposed at a middle-stage of said EMI filter, at an end-stage of said EMI filter, or at both the middle-stage and the end-stage of said EMI filter.

\* \* \* \* \*